United States Patent [19]
Ogata et al.

[11] Patent Number: 5,475,417
[45] Date of Patent: Dec. 12, 1995

[54] LED ARRAY PRINTHEAD AND METHOD OF ADJUSTING LIGHT LUMINANCE OF SAME

[75] Inventors: Hiromi Ogata; Norimichi Teshiba; Masaya Imamura, all of Kyoto, Japan

[73] Assignee: Rohm Co., Ltd., Kyoto, Japan

[21] Appl. No.: 959,652

[22] Filed: Oct. 13, 1992

[30] Foreign Application Priority Data

| Oct. 25, 1991 | [JP] | Japan | 3-279563 |
| Oct. 25, 1991 | [JP] | Japan | 3-279564 |
| Oct. 25, 1991 | [JP] | Japan | 3-279565 |

[51] Int. Cl.⁶ ............................ B41J 2/45; G02B 27/00; B05D 5/06; B05D 1/36
[52] U.S. Cl. .................. 347/244; 347/238; 359/619; 359/620; 427/96; 427/162; 427/256; 427/258; 427/261; 427/407.1
[58] Field of Search ................ 346/107 R, 108, 346/1.1; 359/642, 619, 620, 621; 358/296, 300, 302; 355/1; 430/321; 345/46, 82, 83, 32; 427/110, 96, 162, 256, 258, 261, 407.1; 347/137, 244, 238, 130

[56] References Cited

U.S. PATENT DOCUMENTS

| 4,542,059 | 9/1985 | Toganoh et al. | 427/261 X |
| 4,776,868 | 10/1988 | Trotter, Jr. et al. | 65/18.2 |
| 4,956,684 | 9/1990 | Urata . | |
| 4,980,700 | 12/1990 | Ng | 346/107 R X |
| 5,138,310 | 8/1992 | Hirane et al. | 346/107 R X |
| 5,194,976 | 3/1993 | Nakano et al. | 359/79 |
| 5,266,349 | 11/1993 | Bok | 427/96 X |
| 5,301,063 | 4/1994 | Tohmon | 359/619 |

FOREIGN PATENT DOCUMENTS

| 0367550 | 5/1990 | European Pat. Off. . |
| 3421914 | 11/1986 | Germany . |
| 1-150559 | 6/1989 | Japan . |
| 2-62258 | 3/1990 | Japan . |
| 2-184466 | 7/1990 | Japan . |
| 2-184466 | 7/1990 | Japan . |
| 2-286358 | 11/1990 | Japan . |
| 3-34475 | 2/1991 | Japan . |

OTHER PUBLICATIONS

Roger Grant and Claire Grant, "Grant & Hackh's Chemical Dictionary", McGraw–Hill, Inc., 1987, p. 503.

Primary Examiner—Benjamin R. Fuller
Assistant Examiner—David Yockey
Attorney, Agent, or Firm—William H. Eilberg

[57] ABSTRACT

An LED array printhead comprises a head substrate which carries an array of semiconductor LED chips and an array of drive IC's in corresponding relation to the LED chips. Each of the LED chips has a plurality of light emitting portions. The printhead further comprises a transparent resin coating for covering at least the LED chip array. The resin coating is provided with at least one convex lens portion at a position corresponding to a selected light emitting portion of the LED whose luminance is lower than a predetermined level.

10 Claims, 4 Drawing Sheets

LED ARRAY PRINTHEAD AND METHOD OF ADJUSTING LIGHT LUMINANCE OF SAME

BACKGROUND OF THE INVENTION

1. Field of the Invention

This invention relates to an LED array printhead which is used in an electrophotographic printer for example. The present invention also relates to a method of making such a printhead.

2. Description of the Prior Art

A typical LED array printhead comprises a head substrate which carries an array of semiconductor LED chips and an array of drive IC's connected to the respective LED chips via wires, as disclosed in Japanese Patent Application Laid-open No. 2-184466 for example. The respective LED chips have a multiplicity of light emitting portions to provide a line of light emitting dots, and the respective dots are selectively actuated by the drive IC's for light emission.

In such an printhead, it is necessary to protect the LED chips together with their associated components which are sensitive, thereby preventing these components against deterioration. One way of such protection is to enclose the entire printhead in a protective case. However, use of the protective case results in an increase of size and cost in addition to complicating the structure.

Japanese Patent Application Laid-open No. 3-34475 proposes an LED array printhead wherein use is made of a transparent protective resin coating for covering at least an array of LED chips. Obviously, such an arrangement eliminates the problems caused by the use of a bulky protective case.

However, in any LED array printhead, it is necessary to check the luminance of the respective light emitting portions in order to ensure an acceptable printing quality. If one or more of the light emitting portions cannot meet a minimum luminance level, the relevant LED chip must be removed from the head substrate for replacement by a new one, thus resulting in a cost increase. Further, in case a protective resin coating is formed to cover the LED chip array, the resin coating must be partially removed and then formed again after replacement of an unacceptable chip, consequently requiring a longer time than when no resin coating is provided. Moreover, when the thickness of the resin coating is uneven longitudinally of the printhead, the thickness unevenness of the resin coating itself adds to the unevenness in luminance distribution of the printhead, thus additionally deteriorating the printing quality.

SUMMARY OF THE INVENTION

It is, therefore, an object of the present invention to provide an LED array printhead which is capable of realizing a good printing quality even if one or more LED chips have one or more light emitting portions which are unacceptably low in light luminance.

Another object of the present invention is to provide a method of making such a printhead.

According to the present invention, there is provided an LED array printhead comprising: a head substrate which carries an array of semiconductor LED chips each having a plurality of light emitting portions, the head substrate further carrying an array of drive IC's arranged in corresponding relation of the LED chips and connected electrically to the LED chips; a transparent resin coating for covering at least the LED chips; wherein the resin coating is provided with at least one convex lens portion at a position corresponding to a selected light emitting portion of the LED chip array which is lower in luminance than a predetermined level.

The convex lens portion may be provided by forming the resin coating to become thicker at the lens portion. In this case, the printhead may be made by the steps of: determining light luminance of the respective light emitting portions of the LED chip array before forming the transparent resin coating; and forming the transparent resin coating to become thicker at least at one position corresponding to a selected light emitting portion of the LED chip array which is lower in luminance than a predetermined level.

Alternatively, the convex lens portion may be provided by making an additional deposit of transparent resin on the transparent resin coating which has been previously formed. In this case, the printhead may be made by the steps of: forming the transparent resin coating; determining light luminance, through the transparent resin coating, of the respective light emitting portions of the LED chip array; and forming the convex lens portion by an additional deposit of transparent resin on the resin coating.

Other objects, features and advantages of the present invention will be fully understood from the following detailed description given with reference to the accompanying drawings.

DETAILED DESCRIPTION OF THE PREFERRED EMBODIMENT

Figure 1:
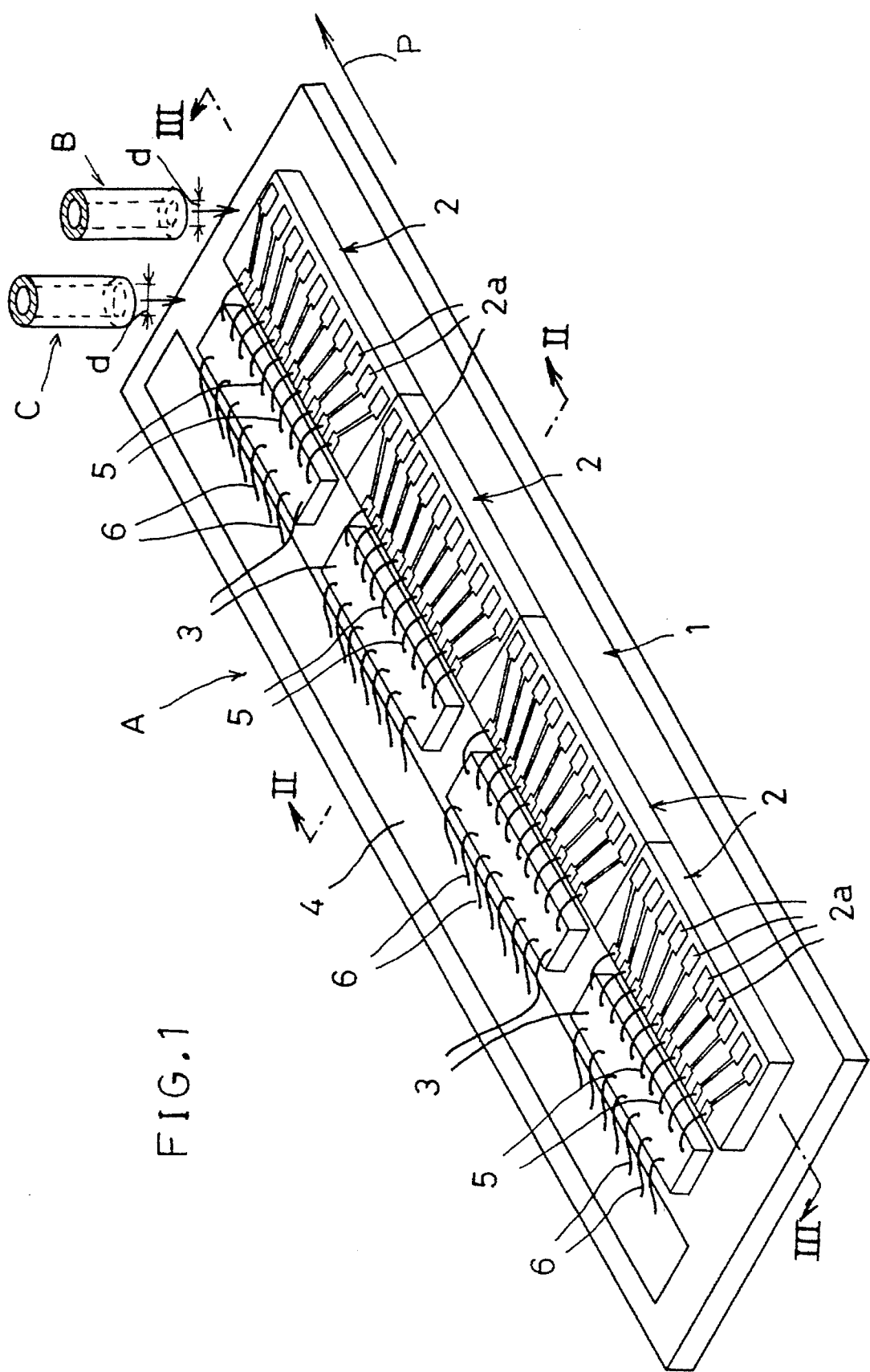
FIG. 1 is a perspective view showing an LED array printhead embodying the present invention.
Figure 2:
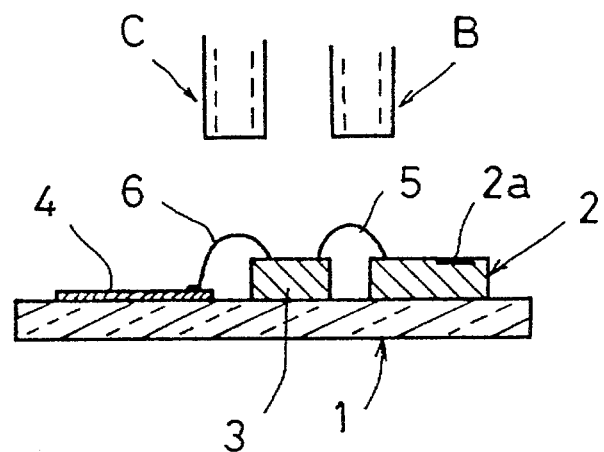
FIG. 2 is a sectional view taken along lines II—II in FIG. 1.

Referring first to FIGS. 1 and 2 of the accompanying drawings, there is illustrated an LED array printhead A which comprises an elongate head substrate 1. The head substrate carries an array of semiconductor LED chips 2 and an array of drive IC's 3 in corresponding relation to the array of LED chips. The head substrate 1 is further formed with a wiring conductor pattern 4 (details not shown).

The LED chips 2 respectively have a plurality of light emitting portions 2a, and the arrangement of the LED chips is such that the light emitting portions 2a of the respective LED chips are constantly spaced longitudinally of the head substrate 1. Thus, a line of light emitting dots (printing dots) is provided by the LED chips 2 to extend longitudinally of the head substrate 1.

The light emitting dot portions 2a of the respective LED chips 2 are connected to the corresponding drive IC's 3 by respective groups of wires 5 arranged in a row, whereas the drive IC's 3 are connected to the wiring conductor pattern 4 by corresponding groups of wires 6 also arranged in a row. The wiring conductor pattern 4 is connected to an external control circuit (not shown) for receiving control signals.

Figure 3:
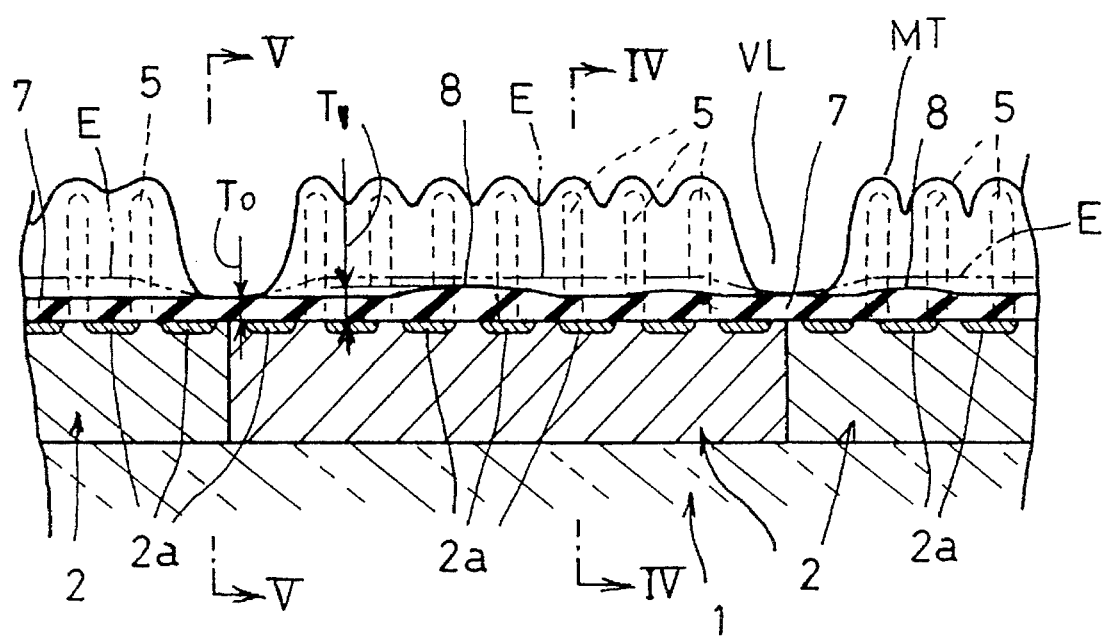
FIG. 3 is an enlarged fragmentary sectional view taken along lines III—III in FIG. 1.
Figure 4:
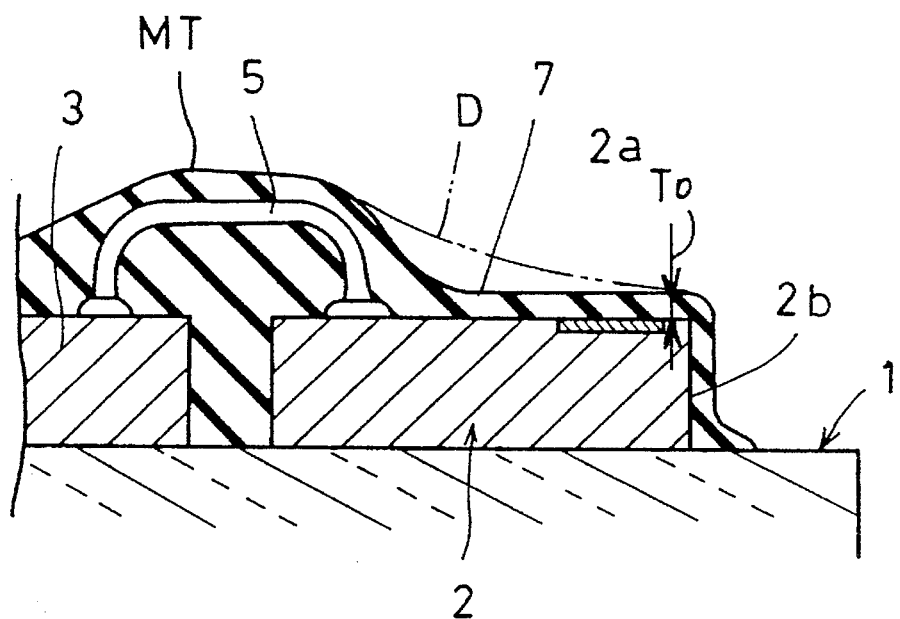
FIG. 4 is a fragmentary sectional view taken along lines IV—IV in FIG. 3.
Figure 5:
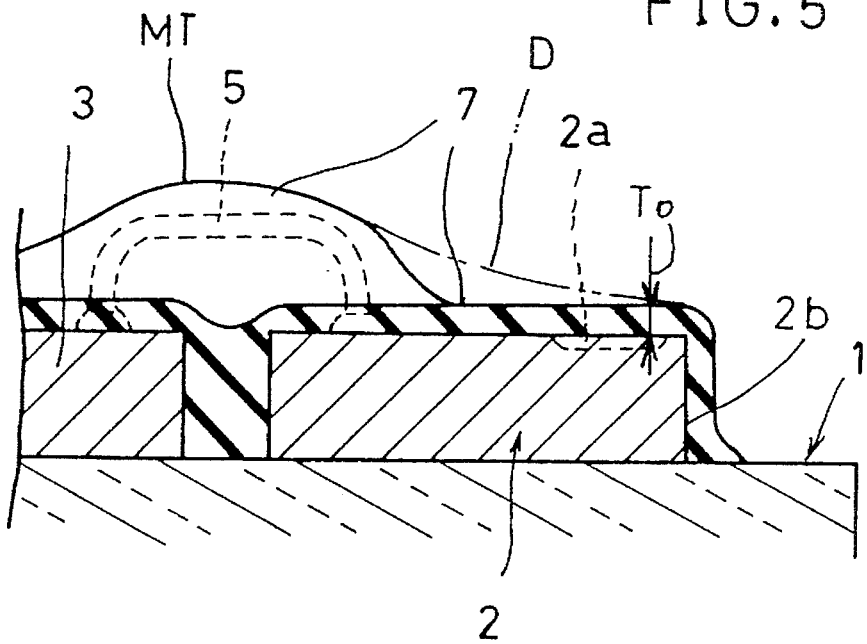
FIG. 5 is a fragmentary sectional view taken along lines V—V in FIG. 3.

As shown in FIGS. 3–5, the printhead further comprises a transparent resin coating 7 which covers the LED chip array 2, the drive IC array 3, the wiring conductor pattern 4 and the respective wire rows 5, 6. According to the illustrated embodiment, the resin coating 7 has convex lens portions 8 at positions corresponding to those light emitting portions 2a whose light luminance is lower than a predetermined level, as best shown in FIG. 3. Thus, the light luminance of the weaker light emitting portions 2a can be intensified by the convex lens portions 8, so that the printhead can provide a luminance distribution which is substantially uniform over the entire length of the printhead.

Obviously, it is necessary to determine the light luminance of the respective light emitting portions 2a of the LED array 2 before forming the transparent resin coating 7. The resin coating 7 is later formed depending on the results of such luminance determination.

The transparent resin coating 7 may be preferably formed by using spray nozzles B, C, as shown in FIGS. 1 and 2. In the illustrated embodiment, one nozzle B is arranged above the row of wires 5 between the LED chip array 2 and the drive IC array 3, whereas the other nozzle C is arranged above the row of wires 6 between the drive IC array and the wiring conductor pattern 4. Each of the nozzles B, C may have a bore diameter d (FIG. 1) of 0.25 mm and spray, in mist form, a resin liquid which contains a thermally hardenable transparent resin such as silicone resin. The resin liquid may be thermally dried for hardening.

At the time of applying the resin liquid, the nozzles B, C may be held fixed, whereas the head substrate 1 is moved longitudinally relative to the nozzles B, C, as indicated by an arrow P in FIG. 1. Alternatively, the head substrate 1 is fixed, whereas the nozzles B, C are moved relative to the head substrate 1 longitudinally thereof. In either case, it has been experimentally found preferable that the relative movement between the head substrate 1 and the nozzles B, C be performed at a speed of 120 mm/sec, and the resin liquid be supplied to the respective nozzles B, C under a feed pressure of 3 kg/cm.

Further, it has been experimentally found preferable that the resin liquid to be sprayed from the respective nozzles B, C have a 25° C. viscosity (viscosity at 25° C.) of 15–50 cp (cp: centi poise). Such a viscosity range is selected for the following reasons.

Due to the surface tension of the resin liquid which is dependent on the viscosity, the resin coating 7 will have a tendency to form mountains MT at the respective groups of wires 5, whereas valleys VL are formed between the respective mountains MT because of relatively larger spacing between the respective groups of wires 5. Thus, the thickness of the resin coating 7 is largest at the respective mountains MT and reduces toward the valleys VL and the light emitting portions 2a of the LED chip array 2, as shown in FIGS. 3–5. It should be appreciated that similar mountains are also formed at the respective groups of wires 6 but not shown in FIGS. 3–5 because these mountains have no direct relation to the invention.

If the 25° C. viscosity of the resin liquid is above 50 cp, the resin coating 7 will have gently inclined skirt portions D (indicated by phantom lines in FIGS. 4 and 5) in front of the respective mountains MT, whereas no such skirt portion is formed in front of the valleys VL. As a result, the thickness of the resin coating 7 along the line of light emitting portions 2a will be larger in front of the mountains MT than in front of the valleys VL, as indicated by phantom lines E in FIG. 3. Thus, the luminance unevenness of the printhead is caused not only by the property variations of the light emitting portions 2a themselves but also by the unintentional thickness variations of the resin coating 7 along the line of light emitting portions 2a.

In other words, if the 25° C. viscosity of the resin liquid is above 50 cp, it is impossible to determine, before forming the resin coating 7, how the luminance of the light emitting portions 2a varies longitudinally of the printhead. Thus, it is necessary to determine and adjust the luminance of the light emitting portions 2a after forming the resin coating.

On the other hand, if the 25° C. viscosity of the resin liquid is no more than 50 cp, the height of the respective mountains MT of the resin coating 7 reduces abruptly from the respective mountain tops toward the light emitting portions 2a due to a reduction of the surface tension of the resin liquid, as indicated by solid lines in FIGS. 4 and 5. As a result, the thickness of the resin coating 7 along the line of light emitting portions 2a can be rendered substantially uniform over the entire length of the head substrate 1 (see FIG. 3). Thus, the luminance unevenness of the printhead is caused only by the property variations of the light emitting portions 2a but not by unintentional thickness variations of the resin coating 7, thereby making it possible to determine, even before forming the resin coating 7, how the luminance of the light emitting portions 2a varies longitudinally of the printhead.

The lower limit (25 cp) for the viscosity of the resin liquid is selected because it becomes time-taking to achieve a predetermined thickness if the viscosity of the resin liquid is too low. Therefore, this lower limit is not an absolute requirement if a longer time of resin deposition process is acceptable.

According to the embodiment shown in FIGS. 1–5, the convex lens portions 8 are formed simultaneously with forming the resin coating 7 itself depending on the luminance variations of the light emitting portions 2a previously determined. Specifically, the resin coating 7 is so formed as to provide a larger thickness T1 only at the convex lens portions 8 while otherwise providing a standard uniform thickness T0.

The convex lens portions or larger thickness portion 8 of the resin coating 7 may be formed by applying the resin liquid at a higher rate from the respective nozzles B, C only at the positions corresponding to the convex lens portions 8 while moving the head substrate 1 at a constant speed (e.g. 120 mm/sec). Alternatively, the convex lens portions 8 may be formed by slowing down the movement of the head substrate 1 only at the positions of the convex lens portions while applying the resin liquid at a constant rate from the respective nozzles B, C.

The thickness T1 of each convex lens portion 8 may be selected depending on the particular luminance of a relevant light emitting portion 2a. Further, the convex lens portion 8 may be made to cover one or more light emitting portions 2a.

Though not shown, the resin coating 7 may be formed in two layers which include a first layer of an entirely uniform thickness and a second layer partially having a larger thickness at each of the convex lens portions 8. In this case, the luminance determination with respect to the light emitting portions 2a of the LED chip array 2 may be performed either before or after forming the first layer.

Figure 6:
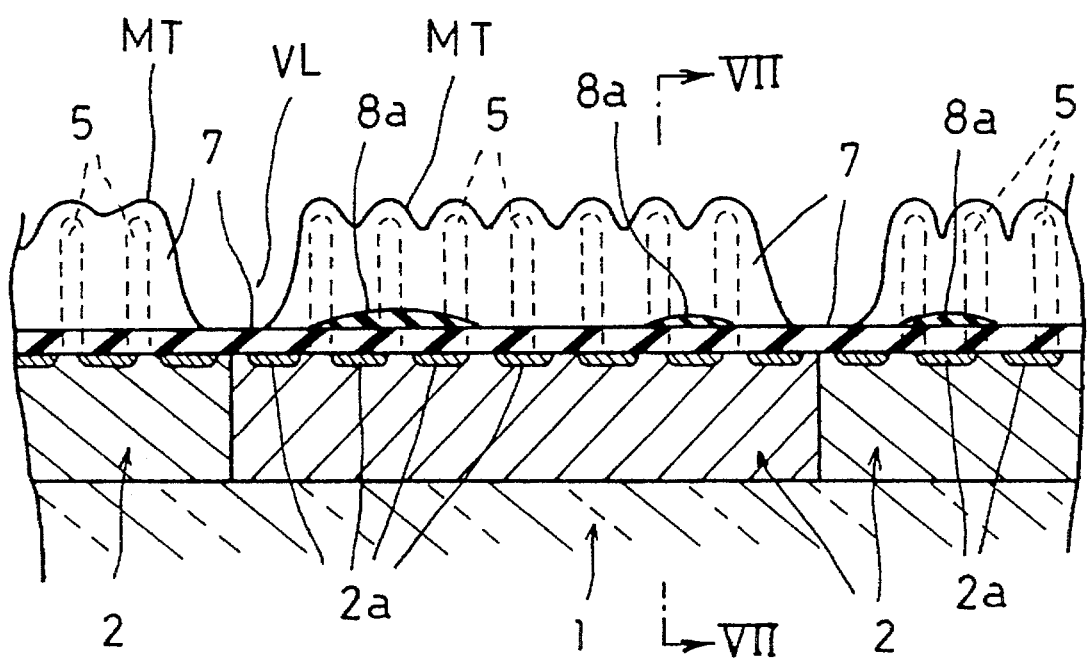
FIG. 6 is a sectional side view similar to FIG. 3 but showing a modified LED array printhead according to the present invention.
Figure 7:
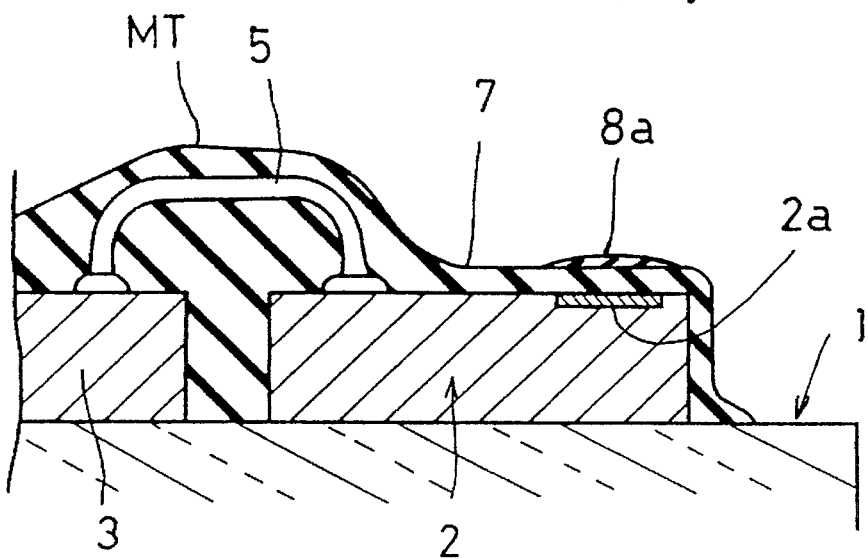
FIG. 7 is a fragmentary sectional view taken along lines VII—VII in FIG. 6.

FIGS. 6 and 7 show a modified LED array printhead. This modified printhead differs from the printhead of the foregoing embodiment only in that transparent convex lens portions 8a are formed separately after forming a transparent resin coating 7 which has a uniform thickness along a line of light emitting portions 2a.

In the modification of FIGS. 6 and 7, the resin coating 7 may be formed substantially in the same manner as already described in connection with the foregoing embodiment. The convex lens portions 8a may be formed by using a resin supplying nozzle or a painting brush. The resin material for the convex lens portions 8a may be similar to that for the resin coating 7 (e.g. silicone rubber) although a different transparent resin may be used.

According to the modification of FIGS. 6 and 7, the luminance of the light emitting portions 2a may be preferably determined after forming the resin coating 7. In this case, consideration can be also taken of the luminance variations caused by the thickness irregularities of the resin coating 7. Thus, it is possible to realize a uniform luminance over the entire length of the printhead even if the thickness of the resin coating 7 is not strictly uniform along the line of light emitting portions 2a. Further, it is also possible to use a resin liquid of more than 50 cp (25° C. viscosity) as a material for the resin coating 7 because luminance adjustment is performed after forming the resin coating 7.

According to the present invention, luminance adjustment is performed on the head substrate 1 by forming one or more convex lens portions 8 or 8a. Thus, even if a certain LED chip 2 has one or more light emitting portions 2a which are unacceptably low in luminance, that particular chip need not be replaced, so that it is possible to increase the production yield and to reduce the production cost while realizing a good printing quality.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. An LED array printhead comprising:

a head substrate which carries an array of semiconductor LED chips each having a plurality of light emitting portions, the head substrate further carrying an array of drive ICs arranged in corresponding relation to the LED chips and connected electrically to the LED chips, at least one of the light emitting portions of the LED chip array being lower in luminance than at least another of the light emitting portions of the LED chip array; and a transparent resin coating extending continuously along the LED chip array and formed on at least the LED chip array;

wherein the resin coating has a convex lens portion at a position corresponding to said at least one of the light emitting portions but no convex lens portion at another position corresponding to said at least another of the light emitting portions.

2. The printhead according to claim 1, wherein the convex lens portion comprises an integral bulge of the resin coating.

3. The printhead according to claim 1, wherein the convex lens portion comprises an additional deposit of transparent resin formed on the transparent resin coating.

4. A method of adjusting light luminance of an LED array printhead, the printhead including a head substrate which carries an array of semiconductor LED chips each having a plurality of light emitting portions, the head substrate further carrying an array of drive ICs arranged in corresponding relation to the LED chips and connected electrically to the LED chips, at least one of the light emitting portions of the LED chip array being lower in light luminance than at least another of the light emitting portions of the LED chip array; the method comprising the steps of:

determining light luminance of each of the light emitting portions of the LED chip array; and forming a transparent resin coating continuously along the LED chip array and making the resin coating become thicker so as to provide a convex lens portion at a position corresponding to said at least one of the light emitting portions which are lower in light luminance but thinner at another position corresponding to said at least another of the light emitting portions which are higher in light luminance, wherein the convex lens portion is provided only at a position corresponding to said at least one of the light emitting portions which are lower in light luminance.

5. The method according to claim 4, wherein the forming step includes the step of applying resin liquid with a 25° C. viscosity of no more than 50 cp and thereafter hardening the resin liquid.

6. The method according to claim 5, wherein the applying step comprises directing the resin liquid through at least one nozzle arranged above the LED chip array, and moving one of the nozzle and the head substrate relative to another of the nozzle and the head substrate.

7. The method according to claim 6, wherein the moving step comprises moving said one of the nozzle and the head substrate at a constant speed, and wherein the applying step is performed at a higher rate when said nozzle is above said at least one of the light emitting portions but at a lower rate when said nozzle is above said at least another of the light emitting portions.

8. The method according to claim 6, wherein the applying step comprises applying the resin liquid at a constant rate, and wherein the moving step comprises moving said one of the nozzle and the head substrate more slowly when said nozzle is above said at least one of the light emitting portions but more rapidly when said nozzle is above said at least another of the light emitting portions.

9. A method of adjusting light luminance of an LED array printhead, the printhead including a head substrate which carries an array of semiconductor LED chips each having a plurality of light emitting portions, the head substrate further carrying an array of drive ICs arranged in corresponding relation to the LED chips and connected electrically to the LED chips, at least one of the light emitting portions of the LED chip array being lower in light luminance than at least another of the light emitting portions of the LED chip array; the method comprising the steps of:

forming a transparent resin coating continuously along the LED chip array;

determining light luminance of each of the light emitting portions of the LED chip array through the transparent resin coating; and forming a convex lens portion, by an additional deposit of transparent resin, only at a position corresponding to said at least one of the light emitting portions which is lower in light luminance.

10. The method according to claim 9, wherein the forming step comprises the step of applying resin liquid with a 25° C. viscosity of no more than 50 cp and thereafter hardening the resin liquid.

\* \* \* \* \*